United States Patent [19]
Le et al.

[11] Patent Number: 5,859,568
[45] Date of Patent: Jan. 12, 1999

[54] TEMPERATURE COMPENSATED AMPLIFIER

[75] Inventors: Hieu M. Le, Midway City; Lloyd F. Linder, Agoura Hills; Erick M. Hirata, Torrance; Don C. Devendorf, Carlsbad, all of Calif.

[73] Assignee: Raytheon Company, El Segundo, Calif.

[21] Appl. No.: 827,854

[22] Filed: Apr. 11, 1997

[51] Int. Cl.$^6$ .................................................. H03F 1/30
[52] U.S. Cl. ..................................... 330/289; 330/296
[58] Field of Search .............................. 330/285, 288, 330/289, 296

[56] References Cited

U.S. PATENT DOCUMENTS

| | | | |
|---|---|---|---|
| 4,260,956 | 4/1981 | Harford | 330/289 |
| 4,339,729 | 7/1982 | Jason et al. | 330/289 X |
| 5,307,027 | 4/1994 | Grasset | 330/289 X |

OTHER PUBLICATIONS

Paul Horowitz and Winfield Hill, *The Art of Electronics*, Cambridge University Press, New York, 1989, p. 869.
Walt Kester Ed., *Linear Design Seminar*, Analog Devices, Norwood, MA, 1991, pp. 8–2 through 8–18.
Wai–Kai Chen, ed., *The Circuits and Filters Handbook*, CRC Press, Boca Raton, Florida, 1995, pp. 1619–16–28.

*Primary Examiner*—Steven Mottola
*Attorney, Agent, or Firm*—Leonard A. Alkov; William C. Schubert; Glenn H. Lenzen, Jr.

[57] ABSTRACT

An amplifier includes an amplifying circuit and bias current circuit. The bias current circuit includes a beta matching circuit which employs a temperature compensated current reference to develop a bias current for the amplifying circuit. The beta matching circuit is connected to track the current gains of transistors within the amplifying circuit and to thereby provide a temperature compensated bias current to the amplifying circuit. The bias current maintains a fixed bias point regardless of temperature-induced, or other, variations of the current gains of the amplifying circuit's transistors.

12 Claims, 2 Drawing Sheets

TEMPERATURE COMPENSATED AMPLIFIER

BACKGROUND OF THE INVENTION

1. Field of the Invention

This invention relates to amplifiers and, more specifically, to amplifiers which provide low-distortion operation while requiring relatively little headroom.

2. Description of the Related Art

Bipolar transistor amplifiers are employed in a wide variety of applications. They are commonly used, for example, as intermediate frequency (IF) amplifiers within radio frequency (RF) receivers.

The conventional bipolar transistor amplifier of FIG. 1 includes NPN transistors Q1 and Q2 connected as a Darlington pair to increase the current gain through the stage and to increase the input impedance. A feedback resistor Rf is connected in series with a base resistor Rb to form a divider between a positive supply voltage V+ and a negative supply voltage V− and to thereby provide bias current to the Darlington pair Q1, Q2. A collector resistor Rc is connected between the positive supply terminal V+ and the Darlington pair's collectors. The resistor Rc minimizes the Darlington's bias current variation over temperature. Resistor Rcomp and capacitor Ccomp, which together, are in parallel with Rf, provide frequency compensation for the amplifier. A peaking inductor L1, typically on the order of a few microhenrys is connected in series between the collector resistor Rc and the Darlington's collectors in order to cancel the effects of stray capacitances and to extend the gain of the amplifier above the normal rolloff frequency. High-frequency techniques such as this are known in the art and are discussed in Paul Horowitz, Winfield Hill, *The Art of Electronics*, Cambridge University Press, New York, 1989, page 869.

Respective degeneration resistors Re1 and Re2 are connected to the emitters of transistors Q1 and Q2. Since signal distortion is inversely proportional to the collector emitter voltage Vce2 of the output transistor Q2, the output transistor Q2 is generally biased at a very high current. Consequently, the degeneration resistor Re2 is typically a very low-valued resistor, i.e. on the order of a few ohms.

Although a conventional amplifier such as this operates satisfactorily for many applications, it is not particularly suited for low-power and/or low supply-voltage applications. One deficiency of the circuit involves the collector resistor Rc, which increases the amplifier's headroom requirement. In some applications, particularly low supply-voltage applications, this increased headroom requirement can be difficult to satisfy. That is, it is generally good design practice to use a single, standard, power supply voltage for a given electronics system. For example, many electronics systems now employ a three-volt power supply. But the voltage drop across the dropping resistor Rc, in combination with the need for high output current (to maximize Vce and thereby minimize distortion), may force a designer to add a higher-voltage power supply to the system in order to use the amplifier of FIG. 1. Another problem is that the resistor Rc dissipates a significant amount of power. This, in itself, is a significant disadvantage. In addition, the increased power dissipation can raise the junction temperature of the Darlington pair, thereby accelerating electro-migration and reducing the expected life-time of the amplifier.

Additionally, the degeneration resistor Re2 must be a low-value resistor, on the order of a few ohms, in order to meet the amplifier's headroom requirement. Due to the resistor's low value, a small variation in its resistance, due for example to manufacturing tolerances, can lead to a significant change in the amplifier's bias current.

SUMMARY OF THE INVENTION

In view of the above problems, the present invention is directed to a temperature compensated amplifier which provides low-distortion operation while requiring relatively low voltage headroom.

The invention comprises a current-gain (beta) matching circuit and an amplifying circuit. The beta matching circuit employs a temperature compensated current source to provide a bias current for the amplifying circuit. As the beta of a transistor within the amplifying circuit varies, the beta matching circuit emulates this variation, automatically adjusting the amplifying circuit's bias current and thereby maintaining a fixed bias point which is largely independent of temperature and beta changes.

The beta matching circuit includes transistors connected in the same circuit configuration as in the amplifying circuit. Corresponding transistors within the beta matching circuit are fabricated using the same processes, e.g., identical doping, etc., as those in the amplifying circuit. Additionally, a corresponding transistor within the beta matching circuit is operated with the same current density as one in the amplifying circuit. Therefore, the current gains of corresponding transistors within the amplifier and within the beta matching circuit are equal. Although the beta matching transistors may match the corresponding transistors within the amplifying circuit, i.e., have the same base/emitter area, as well as other device characteristics, in the preferred embodiment the base-emitter areas of transistors within the beta matching circuit are a fraction of those within the amplifying circuit but their emitter current densities match those of the amplifier circuit.

In a preferred embodiment the bias circuit is fabricated within the same integrated circuit as the amplifying circuit. The preferred amplifier includes a Darlington pair connected as a common emitter amplifier, as does the beta-matching circuit. The emitter currents of the beta matching circuit are provided by a band-gap reference and the emitter current densities of the beta matching Darlington are set equal to the emitter current densities of the amplifying Darlington, thus ensuring that the betas of corresponding transistors in the amplifying and beta matching circuits equal one another. In the preferred embodiment, this equality of current densities is established by setting the emitter currents of the beta matching circuit at a fixed ratio N of the emitter currents of the amplifying Darlington pair and the emitter areas of the beta matching circuit at 1/N of the emitter areas of the amplifying circuit's Darlington.

The preferred amplifier also includes an offset circuit, connected between the amplifying Darlington input and a power supply terminal, that includes series-connected diodes whose forward voltage drops match and track the base-emitter voltages of the Darlington pair.

These and other features and advantages of the invention will be apparent to those skilled in the art from the following detailed description of preferred embodiments, taken together with the accompanying drawings.

DETAILED DESCRIPTION OF THE INVENTION

The new temperature compensated amplifier incorporates a biasing scheme which significantly reduces the amplifier's headroom requirements in comparison with prior amplifiers. By applying a significant portion of the available supply voltage across the collector/emitter of its output transistor, the new amplifier provides low distortion operation while at the same time permitting operation from a relatively low power supply voltage.

Figure 1:
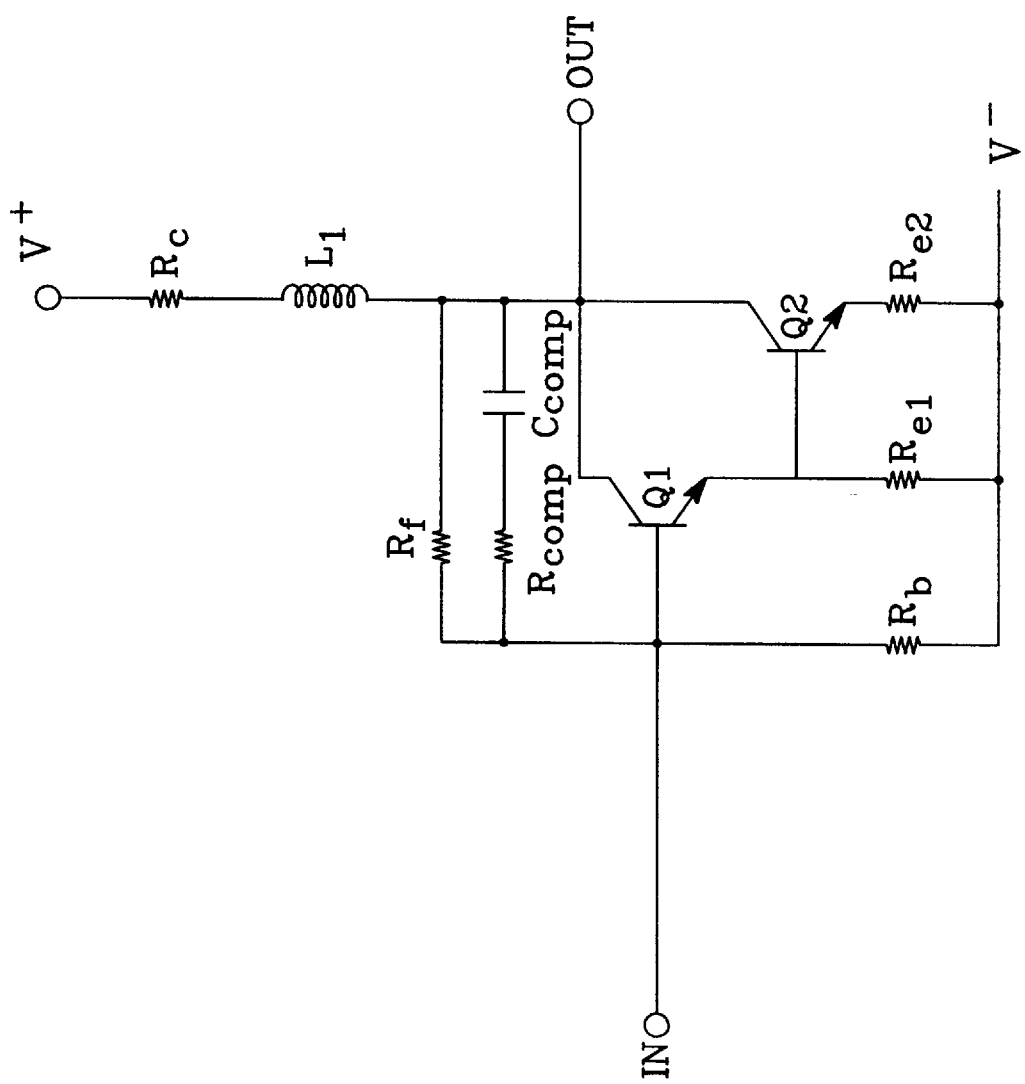
FIG. 1 is a schematic diagram of a conventional common-emitter Darlington amplifier.
Figure 2:
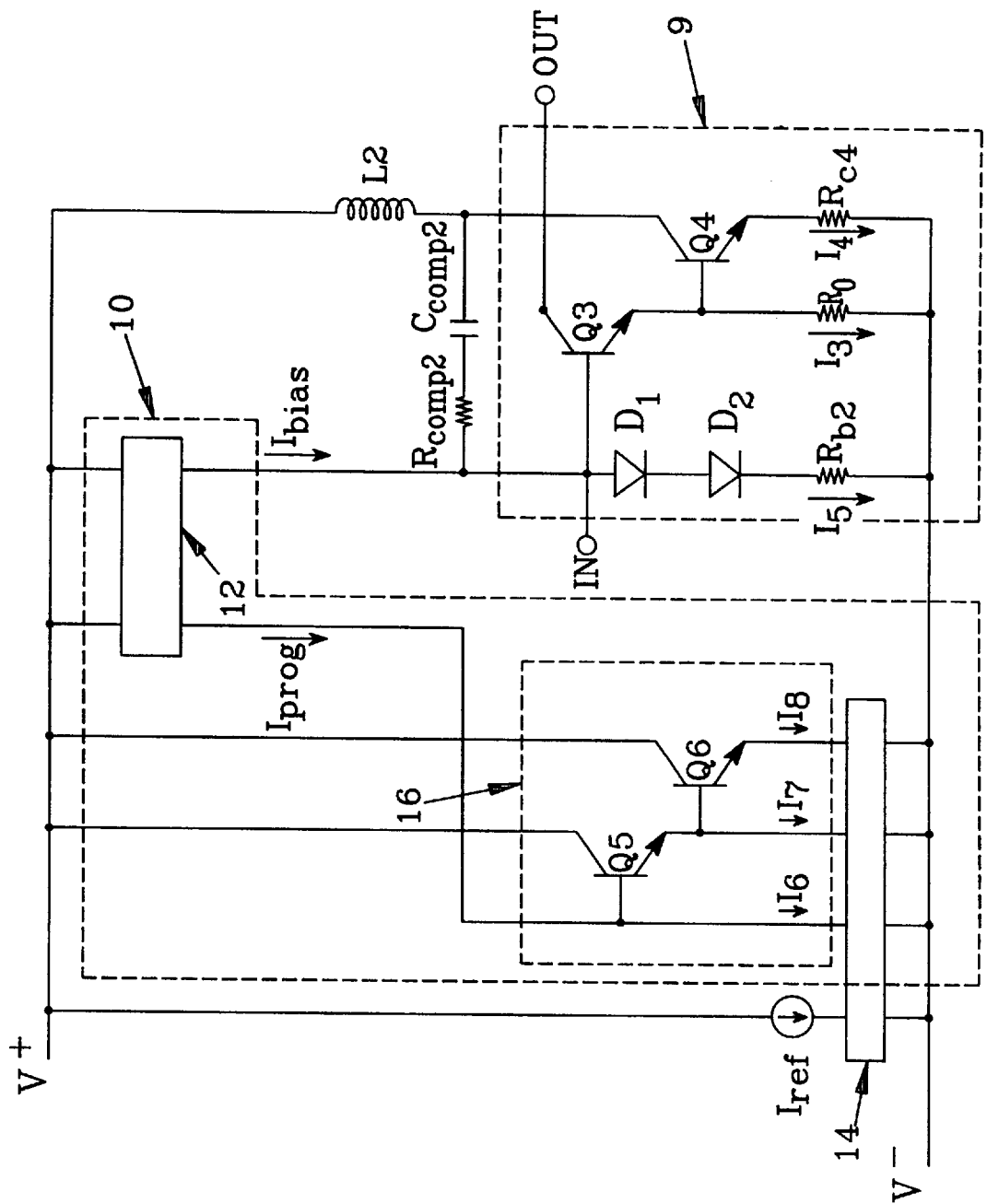
FIG. 2 is schematic diagram of the preferred embodiment of the new temperature compensated amplifier.

The schematic diagram of FIG. 2 illustrates a preferred Darlington pair implementation of the new amplifier 9. Bipolar NPN transistors Q3 and Q4 are connected in a Darlington configuration, with degeneration resistors Re3 and Re4 connected between the emitters of Q3 and Q4 and a negative voltage supply terminal V−. The collectors of the Darlington pair are connected to an output terminal OUT of the new amplifier, and the base of transistor Q3 is connected to the input terminal IN. A compensation resistor Rcomp2 and a compensation capacitor Ccomp2 are connected in series between the input IN and output OUT terminals to provide frequency compensation and to thereby ensure stability of the amplifier in a conventional manner.

Diodes D1 and D2 and a resistor Rb2 are connected in series between the input terminal IN and the negative voltage supply terminal V−. The diodes D1 and D2 are selected so that their forward voltage drops are substantially equal to the base-emitter voltages of the transistors Q3 and Q4, respectively. This may be achieved by implementing the diodes in a conventional manner as bipolar transistors with their collectors and bases connected together and their base-emitter areas a fraction of the base-emitter areas of the Darlington transistors Q3 and Q4, and forcing an appropriate current through them. For example, if the base-emitter areas of Q3 and Q4 are equal to a given area A and the transistors are biased to emitter currents of 10 mA and 100 mA, respectively, and a current of 1 mA is forced through the diodes D1 and D2, the total voltage drop across the diodes will equal the total of base-emitter drops for transistors Q3 and Q4 if one diode has a base-emitter area of 0.1A and that of the other diode has an area of 0.01A. Similarly, the value of the resistor Rb2 is selected so that the voltage across it equals the voltage across the degeneration resistor Re4 when the amplifier is operating at its neutral bias point. A peaking inductor L2 is connected between the positive supply terminal V+ and the output terminal to increase the output dynamic range. Currents I3 and I4 flow through resistors Re3 and Re4, respectively, and a current I5 flows through the resistor Rb2.

A temperature-compensated bias current circuit 10, including first 12 and second 14 current mirrors and a beta-matching circuit 16, is connected to provide a temperature-compensated bias current Ibias to the new amplifier 9. A programming current Iprog is accepted by the mirror 12 and reflected, either directly or preferably, as a multiple of the programming current, to produce Ibias. In the illustrated preferred embodiment the current mirror 12 reflects Ibias with a value N times the value of Iprog. By using a value N greater than one rather than a direct one-to-one mirroring, the power dissipated by the bias current circuit 10 is reduced.

The programming current Iprog is developed by the beta matching circuit 16 so that, as the betas of the Darlington pair Q3,Q4 vary over temperature, the programming current Iprog will vary in the same manner and thereby produce a temperature compensated bias current Ibias to maintain a stable bias point for the amplifier 9. A temperature compensated reference current Iref is supplied to the current mirror 14, which reflects Iref, in ratios to be discussed shortly, to the emitters of a Darlington-connected pair consisting of NPN transistors Q5 and Q6, and in a current I6 drawn between the base of the input transistor Q5 and the negative supply voltage terminal. The current I6 is set equal to 1/N times the current I5 which is desired through resistor Rb2. Similarly, the emitter currents I7 and I8 reflected by the current mirror 14 are connected to sink 1/N times the emitter currents I3 and I4 through the emitters of transistors QS and Q6, respectively. That is, the currents I6, I7 and I8 are constant multiples of the reference current Iref: (k1)Iref,(k2)Iref and (k3)Iref, respectively, where k1, k2 and k3 are constants determined by the ratioing of the mirror 14.

The Darlington pair Q5,Q6 of the beta-matching circuit 16 is fabricated using the same process as the amplifying Darlington pair Q3, Q4; in the preferred embodiment all the transistors are formed in a single integrated circuit. Additionally, the transistors are ratioed (i.e., their base-emitter junction areas are ratioed) so that when operating with the current ratios just described, the emitter current density of transistor Q5 matches that of Q3 and the emitter current density of transistor Q6 matches that of transistor Q4. With equal current densities, the betas of transistors Q5 and Q6 match the betas of transistors Q3 and Q4, respectively.

The bias current Ibias supplied to the amplifier 9, assuming only DC input, may be described by the following equation:

$$I\text{bias} = I5 + (I3 + I4/(\beta 4 + 1))/(\beta 3 + 1) \tag{1}$$

where:

$\beta 3$ = the current gain of transistor Q3
$\beta 4$ = the current gain of transistor Q4

Similarly, the programming current Iprog, supplied by the beta-matching circuit 16 to the current mirror 12, may be described by the following equation:

$$I\text{prog} = I6 + (I7 + I8/(\beta 6 + 1))/(\beta 5 + 1) \tag{2}$$

where:

$\beta 5$ = the current gain of transistor Q5
$\beta 6$ = the current gain of transistor Q6

Since the current gain $\beta 5$ equals $\beta 3$ and $\beta 6$ equals $\beta 4$, equation (2) may be rewritten:

$$\begin{aligned} I\text{prog} &= I6 + (I7 + I8/(\beta 4 + 1))/(\beta 3 + 1) \\ &= k1 Iref + (k2 Iref + k3 Iref/(\beta 4 + 1))/(\beta 3 + 1) \end{aligned} \tag{3}$$

Additionally, since I5/I6=I3/I7=I4/I8=N and

I5=Nk1Iref
I6=Nk2Iref
I7=Nk3Iref $$I\text{bias} = Nk1 Iref + (Nk2 Iref + Nk3 Iref/(\beta 4 + 1))/(\beta 3 + 1) \tag{4}$$

That is, the bias circuit provides a biasing current to the amplifying circuit which accommodates temperature and current gain variations in the amplifying circuit to yield currents within the amplifying circuit which are constant multiples of a temperature compensated reference current and are therefore themselves substantially independent of temperature.

Consequently, the collector resistor employed by conventional amplifiers to reduce the amplifier's bias current sensitivity to variations in power supply voltage (which may be due to temperature variations) may be eliminated. Since the collector resistor of a conventional amplifier can consume several volts of headroom, the new bias circuit without a collector resistor permits the amplifier to operate from a lower voltage power supply while maintaining the same collector-emitter voltage across its output transistor. Additionally, since the new amplifier remains a single stage, no instability has been introduced to the design.

Any one of numerous temperature compensated current references may be used to generate Iref, such as a Zener reference or a bandgap reference. For a more complete discussion of current references, see Walt Kester Ed., *Linear Design Seminar*, Analog Devices, Norwood, Mass., 1991 pgs 8–2 through 8–18. Similarly, the current mirrors 12 and 14 may be implemented using conventional current mirror designs which may employ NPN or PNP bipolar transistors, or N-channel or P-channel field effect transistors. Various current mirror circuits have been developed and some of them are discussed in Wai-Kai Chen, ed., *The Circuits and Filters Handbook*, CRC press, Boca Raton, Fla., 1995, pp 1619–1628.

While one embodiment of the invention has been shown and described, numerous variations and alternate embodiments will occur to those skilled in the art. Such variations and alternate embodiments are contemplated, and can be made without departing from the spirit and scope of the invention as defined in the appended claims. For example, the common-emitter amplifiers may be implemented using PNP or NPN transistors and may employ single-transistor architectures, as opposed to the Darlington-pair configuration illustrated.

I claim:

1. A temperature compensated bias current source for providing bias current to an amplifier which includes a transistor circuit with at least one transistor have a current gain ($\beta$) with a known temperature variation, comprising:
    a temperature compensated reference current source,
    a first current mirror connected to receive a reference current from said reference current source as an input,
    a beta matching circuit, comprising a respective transistor having the same current gain as each transistor within the amplifier, driven by said first current mirror to provide an output programming current characterized by said known temperature variation, and
    a second current mirror connected to be driven by said programming current to provide a bias current for said amplifier equal to N times the said programming current, wherein N is a predetermined fixed ratio.

2. The bias current source of claim 1, wherein said beta matching circuit comprises a transistor circuit which emulates the amplifier transistor circuit.

3. The bias current source of claim 2, wherein said beta matching circuit comprises a pair of bipolar transistors connected as a Darlington pair common emitter amplifier.

4. The bias current source of claim 3, wherein said common emitter amplifier includes an input terminal connected to establish said programming current.

5. The bias current source of claim 4, wherein said beta matching circuit provides said programming current with a value equal to a constant K times said reference current.

6. A temperature compensated amplifier which includes a transistor circuit with at least one transistor having a current gain ($\beta$) with a known temperature variation, comprising:
    an amplifying circuit including a transistor having current conduction terminals and a current control terminal, said transistor connected to amplify signals presented to its current control terminal, and
    a temperature compensation bias current source connected to provide bias current to said amplifying circuit, said bias current source comprising:
    a temperature compensated reference current source,
    a first current mirror connected to receive a reference current from said reference current source as an input,
    a beta matching circuit, comprising a transistor having the same current gain as a transistor within the amplifying circuit, driven by said first current mirror to provide an output programming current characterized by said known temperature variation, and
    a second current mirror connected to be driven by said programming current to provide a bias current for said amplifier equal to N times the said programming current, wherein N is a predetermined fixed ratio.

7. The amplifier of claim 6, wherein said beta matching circuit comprises transistors connected in the same circuit configuration as transistors within said amplifying circuit.

8. The amplifier of claim 7, wherein the beta matching circuit comprises a pair of bipolar transistors connected as a Darlington pair common emitter amplifier.

9. The amplifier of claim 8, wherein the common emitter amplifier includes an input terminal and said input terminal is connected to establish said programming current.

10. The amplifier of claim 9, wherein the bias current supplied to the amplifying circuit equals the product of N, K and the reference current supplied by said temperature compensated current reference, wherein K is a predetermined constant.

11. The amplifier of claim 10, wherein said amplifying circuit comprises a common emitter Darlington pair with the base terminal of the input transistor forming the input terminal of the amplifying circuit.

12. The amplifier of claim 11, wherein said amplifying circuit further comprises an offset circuit connected between the input terminal of said amplifying circuit and the negative supply terminal, said offset circuit comprising series-connected diodes which are connected to produce forward voltage drops equal to the base-emitter voltages of the Darlington pair.

* * * * *